United States Patent
Volkovich et al.

(10) Patent No.: US 11,226,566 B2
(45) Date of Patent: *Jan. 18, 2022

(54) METHOD OF MEASURING MISREGISTRATION OF SEMICONDUCTOR DEVICES

(71) Applicant: KLA-TENCOR CORPORATION, Milpitas, CA (US)

(72) Inventors: Roie Volkovich, Migdal Ha'emek (IL); Ido Dolev, Manof (IL)

(73) Assignee: KLA-Tencor Corporation, Milpitas, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/161,035

(22) Filed: Jan. 28, 2021

(65) Prior Publication Data
US 2021/0149314 A1 May 20, 2021

Related U.S. Application Data

(63) Continuation of application No. 16/349,101, filed as application No. PCT/US2019/027114 on Apr. 12, 2019, now Pat. No. 10,928,739.
(Continued)

(51) Int. Cl.
*G03F 7/20* (2006.01)
*G01N 21/47* (2006.01)
(Continued)

(52) U.S. Cl.
CPC ......... *G03F 7/70633* (2013.01); *G01N 21/47* (2013.01); *G01N 21/9501* (2013.01);
(Continued)

(58) Field of Classification Search
CPC ............... G01N 21/47; G01N 21/9501; G03F 7/70508; G03F 7/70516; G03F 7/70616; G03F 7/70625; G03F 7/70633; G03F 9/7007; G03F 9/7019; H01L 21/67288; H01L 22/12; H01L 23/544
(Continued)

(56) References Cited

U.S. PATENT DOCUMENTS

2016/0313658 A1* 10/2016 Marciano .............. G03F 9/7003

* cited by examiner

*Primary Examiner* — Colin W Kreutzer
(74) *Attorney, Agent, or Firm* — Hodgson Russ LLP

(57) ABSTRACT

A method of measuring misregistration in the manufacture of semiconductor devices including providing a multilayered semiconductor device, using a scatterometry metrology tool to perform misregistration measurements at multiple sites on the multilayered semiconductor device, receiving raw misregistration data for each of the misregistration measurements, thereafter providing filtered misregistration data by removing outlying raw misregistration data points from the raw misregistration data for each of the misregistration measurements, using the filtered misregistration data to model misregistration for the multilayered semiconductor device, calculating correctables from the modeled misregistration for the multilayered semiconductor device, providing the correctables to the scatterometry metrology tool, thereafter recalibrating the scatterometry metrology tool based on the correctables and measuring misregistration using the scatterometry metrology tool following the recalibration.

16 Claims, 3 Drawing Sheets

Related U.S. Application Data

(60) Provisional application No. 62/808,995, filed on Feb. 22, 2019.

(51) Int. Cl.
*G01N 21/95* (2006.01)
*H01L 21/67* (2006.01)
*H01L 21/66* (2006.01)
*H01L 23/544* (2006.01)

(52) U.S. Cl.
CPC ...... *G03F 7/70508* (2013.01); *G03F 7/70625* (2013.01); *H01L 21/67288* (2013.01); *H01L 22/12* (2013.01); *H01L 23/544* (2013.01)

(58) Field of Classification Search
USPC .............................. 355/67, 77; 356/399–401
See application file for complete search history.

METHOD OF MEASURING MISREGISTRATION OF SEMICONDUCTOR DEVICES

REFERENCE TO RELATED APPLICATIONS

The application is a continuation of U.S. patent application Ser. No. 16/349,101 filed May 10, 2019, which is a national stage entry of PCT/US19/27114 filed Apr. 12, 2019, which claims priority to U.S. Patent Application No. 62/808,995 filed Feb. 22, 2019, the disclosures of which are hereby incorporated by reference and priority of which is hereby claimed.

FIELD OF THE INVENTION

The present invention relates to the field of metrology, and more particularly, to metrology recipe setup and measurement procedures.

BACKGROUND OF THE INVENTION

Various types of devices for metrology, and metrology recipe setup and measurement procedures are known.

SUMMARY OF THE INVENTION

The present invention seeks to provide an improved method for metrology, and more particularly, for metrology recipe setup and measurement procedures.

There is thus provided in accordance with a preferred embodiment of the present invention a method of measuring misregistration in the manufacture of semiconductor devices including providing a multilayered semiconductor device, using a scatterometry metrology tool to perform misregistration measurements at multiple sites on the multilayered semiconductor device, receiving raw misregistration data for each of the misregistration measurements, thereafter providing filtered misregistration data by removing outlying raw misregistration data points from the raw misregistration data for each of the misregistration measurements, using the filtered misregistration data to model misregistration for the multilayered semiconductor device, calculating correctables from the modeled misregistration for the multilayered semiconductor device, providing the correctables to the scatterometry metrology tool, thereafter recalibrating the scatterometry metrology tool based on the correctables and measuring misregistration using the scatterometry metrology tool following the recalibration.

In accordance with a preferred embodiment of the present invention, the outlying raw misregistration data points are beyond three standard deviations from corresponding data points.

According to a preferred embodiment, the method also includes modeling the raw misregistration data for each of the misregistration measurements and the corresponding data points include corresponding data points of the modeled raw misregistration data. Additionally or alternatively, according to a preferred embodiment, the method also includes using the scatterometry metrology tool to perform misregistration measurements with different parameters at each of the multiple sites on the multilayered semiconductor device and the corresponding data points include raw misregistration data points from at least one of the misregistration measurements with different parameters. Additionally or alternatively, the corresponding data points include raw misregistration data points surrounding the outlying raw misregistration data points.

According to a preferred embodiment, the filtered misregistration data also includes replacement misregistration data points. According to a preferred embodiment, the replacement misregistration data points are generated from an average of raw misregistration data points surrounding each of said outlying raw misregistration data points. Additionally or alternatively, the replacement misregistration data points are generated from corresponding raw misregistration data points taken from additional scatterometry misregistration measurements at the multiple sites on said multilayered semiconductor device. Additionally or alternatively, according to a preferred embodiment, the method also includes modeling the raw misregistration data for each of the misregistration measurements and the replacement misregistration data points are generated from corresponding data points of the modeled raw misregistration data. Additionally or alternatively, according to a preferred embodiment, the method also includes using the scatterometry metrology tool to perform misregistration measurements with different parameters at each of the multiple sites on the multilayered semiconductor device and the replacement misregistration data points are generated from corresponding data points from at least one of the misregistration measurements with different parameters. Additionally or alternatively, according to a preferred embodiment, the method also includes using the scatterometry metrology tool to perform misregistration measurements at corresponding ones of the multiple sites on a multilayered semiconductor device different from the multilayered semiconductor device provided initially and the replacement misregistration data points are generated from corresponding raw misregistration data points from the corresponding ones of multiple sites.

In accordance with a preferred embodiment, the measurement of misregistration using the scatterometry metrology tool following the recalibration is performed on the multilayered semiconductor device. Alternatively, according to a preferred embodiment, the measurement of misregistration using the scatterometry metrology tool following the recalibration is performed on a multilayered semiconductor device different from the multilayered semiconductor device provided initially.

In accordance with a preferred embodiment, the method also includes providing the correctables to a lithography tool. In accordance with a preferred embodiment, the method also includes providing the correctables to an etching tool.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1A:
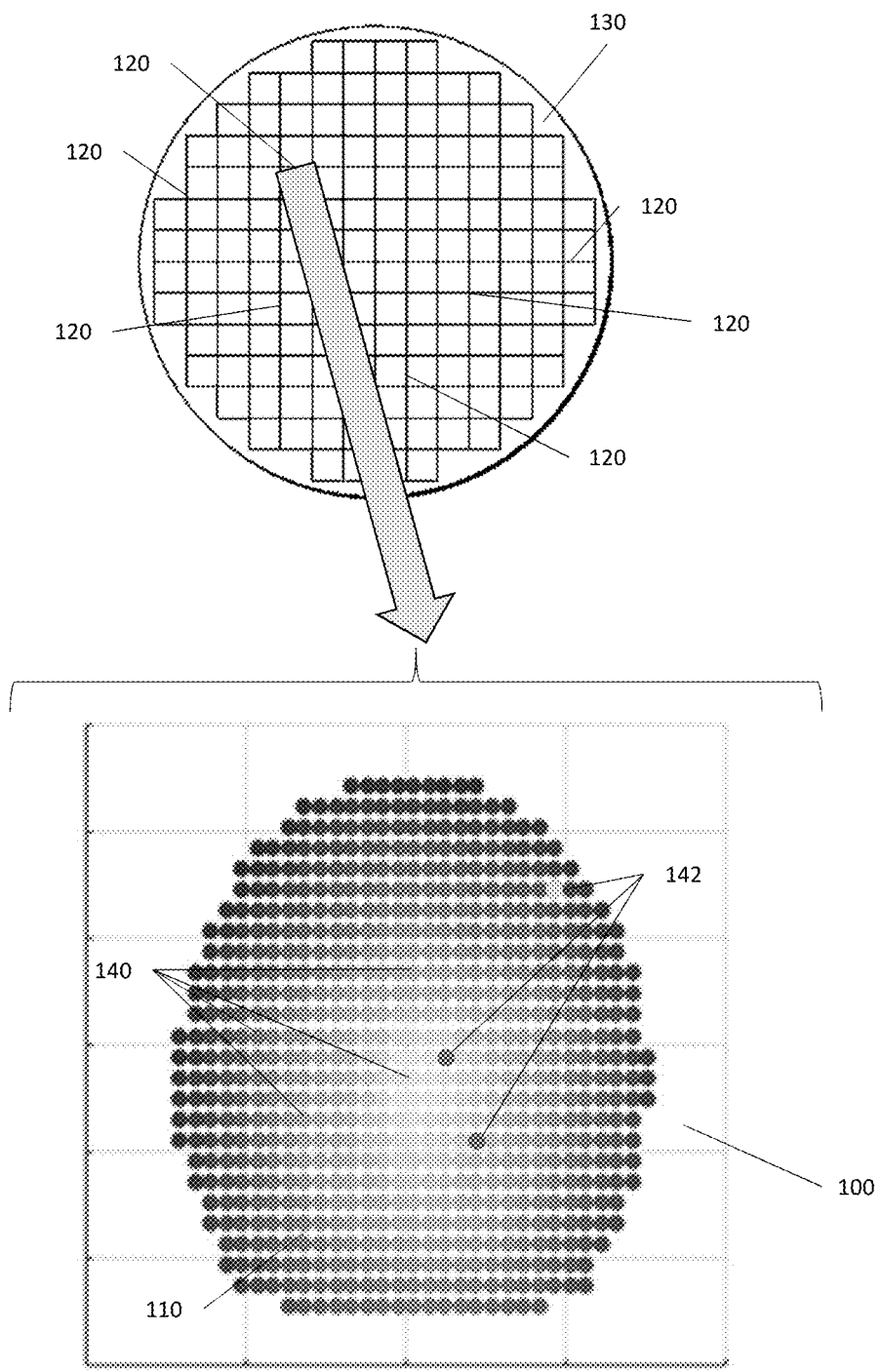
FIG. 1A is a simplified pupil image illustrating typical raw misregistration data for one of a plurality of measurement sites on a multilayered semiconductor device.

Reference is now made to FIG. 1A, which is a simplified pupil image 100 illustrating typical raw misregistration data 110 for one of a plurality of measurement sites 120 on a multilayered semiconductor device 130. It is appreciated that while FIG. 1A shows measurement sites 120 only on scribe lines, measurement sites 120 can be located anywhere on multilayered semiconductor device 130. It is noted that raw misregistration data 110 includes multiple raw misregistration data points 140, including a plurality of outlying raw misregistration data points 142. It is appreciated that outlying raw misregistration data points 142 may be identified in a variety of ways, including, inter alia, machine learning, comparison to raw misregistration data points 140 surrounding outlying raw misregistration data points 142, and comparison between raw misregistration data points 140 taken at the same measurement site 120 under different scatterometry misregistration measurement parameters. Preferably, outlying raw misregistration data points 142 are those raw misregistration data points 140 that are beyond three standard deviations from data points to which they are compared.

Figure 1B:
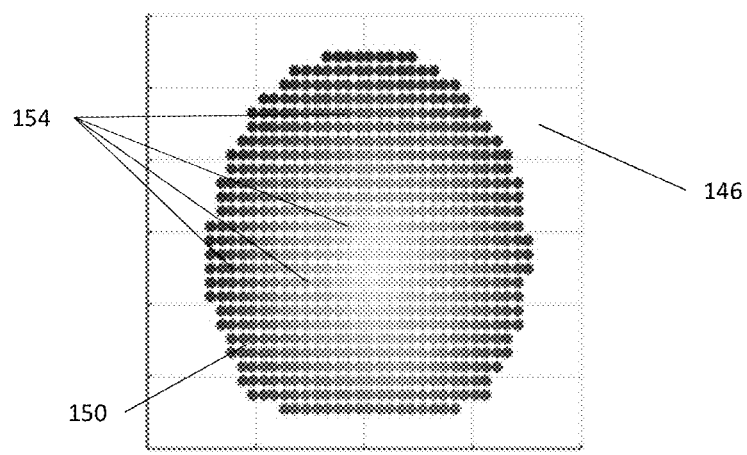
FIG. 1B is a simplified pupil image illustrating typical modeled raw misregistration data, corresponding to the raw misregistration data of FIG. 1A.

Reference is now made to FIG. 1B, which is a simplified pupil image 146 illustrating typical modeled raw misregistration data 150 for one of measurement sites 120 on multilayered semiconductor device 130. It is noted that modeled raw misregistration data 150 includes multiple modeled raw misregistration data points 154. It is appreciated that modeled raw misregistration data 150 is generated from raw misregistration data 110 from, inter alia, data fitting and physics-based considerations. It is noted that modeled raw misregistration data 150 can be calculated either from a static model approach, wherein the same model is used for all data points, or from a dynamic model approach, wherein the model can be optimized for each data point.

It is further appreciated that modeled raw misregistration data 150 may be used to help determine which raw misregistration data points 140 are outlying raw misregistration data points 142. In a particular embodiment of the present invention, outlying raw misregistration data points 142 are those raw misregistration data points 140 that are beyond three standard deviations from corresponding modeled raw misregistration data points 154.

Figure 1C:
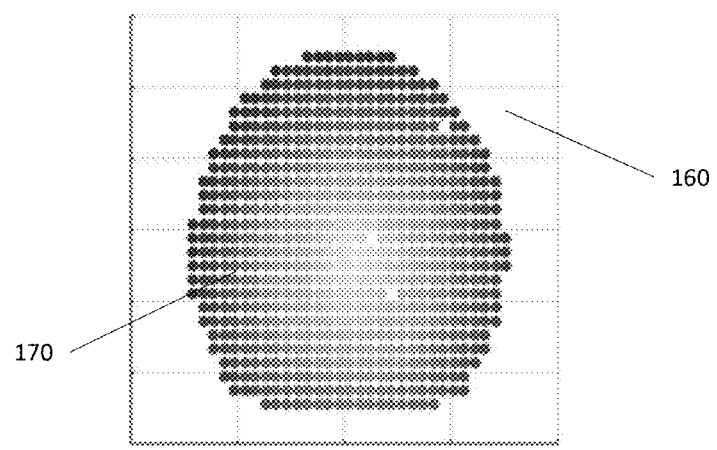
FIG. 1C is a simplified pupil image illustrating typical filtered misregistration data, corresponding to the raw misregistration data of FIG. 1A.
Figure 1D:
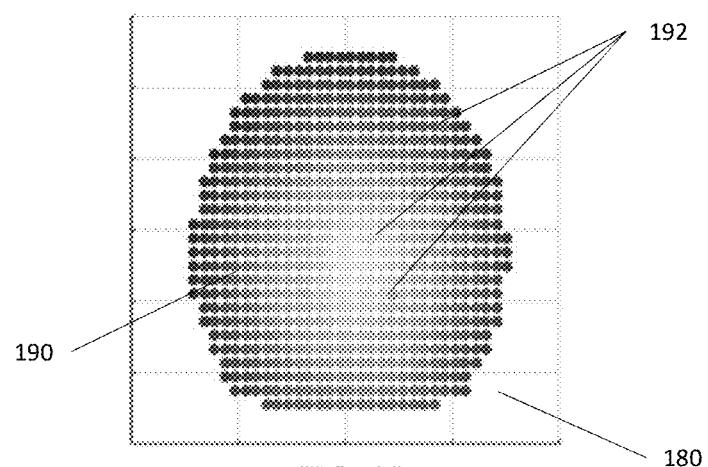
FIG. 1D is a simplified pupil image illustrating typical modified filtered misregistration data, corresponding to the raw misregistration data of FIG. 1A.

Reference is now made to FIG. 1C, which is a simplified pupil image 160 illustrating typical filtered misregistration data 170, obtained by removing outlying raw misregistration data points 142 from raw misregistration data 110. In FIG. 1D, which is a simplified pupil 180 illustrating typical modified filtered misregistration data 190, outlying raw misregistration data points 142 have been replaced by replacement misregistration data points 192.

It is appreciated that replacement misregistration data points 192 may be any suitable replacement misregistration data points 192, including, inter alia, replacement misregistration data points 192 generated from an average of raw misregistration data points 140 surrounding each of outlying raw misregistration data points 142, and replacement misregistration data points 192 generated from corresponding raw misregistration data points 140 taken from additional scatterometry misregistration measurements at other measurement sites 120 on semiconductor device 130.

Additional suitable replacement misregistration data points 192 include replacement misregistration data points 192 generated from corresponding modeled raw misregistration data points 154, replacement misregistration data points 192 generated from corresponding scatterometry misregistration measurements of the same measurement site 120 taken with different measurement parameters, and replacement misregistration data points 192 generated from corresponding raw misregistration data points 140 taken from additional scatterometry misregistration measurements at corresponding measurement sites 120 on a different multilayered semiconductor device 130.

Figure 2:
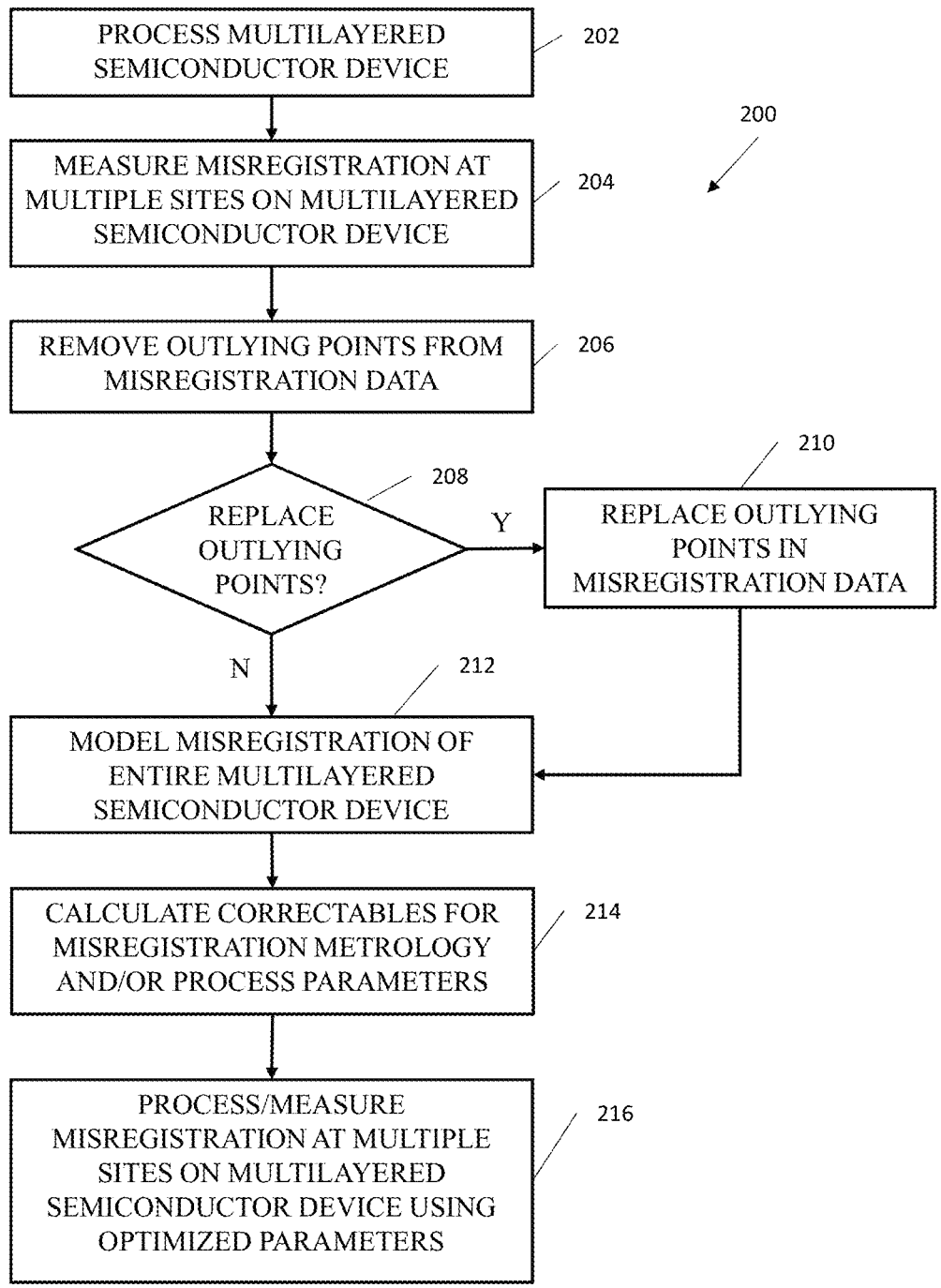
FIG. 2 is a simplified flowchart illustrating a method of measuring misregistration in the manufacture of semiconductor devices.

Reference is now made to FIG. 2, which is a simplified flowchart illustrating a method 200, which is useful in measuring misregistration in the manufacture of semiconductor devices.

As seen at a first step 202, a user performs at least one fabrication procedure in the manufacture of multilayered semiconductor device 130. Such a fabrication procedure may include, inter alia, a lithography, etching, or polishing step. Following the fabrication procedure of first step 102, a scatterometry metrology tool is used to measure the misregistration of various layers at multiple measurement sites 120 of multilayered semiconductor device 130, as seen at a next step 204. A typical scatterometry metrology tool used in step 204 is an ATL™ 100, commercially available from KLA-Tencor Corporation of Milpitas, Calif., USA.

As seen at a next step 206, raw misregistration data 110 obtained in step 204 is analyzed and outlying raw misregistration data points 142 are removed from each of pupil images 100 obtained from measurement sites 120, and filtered misregistration data 170 is stored. Following removal of outlying raw misregistration data points 142, at a next step 208, a decision is made whether or not to replace outlying raw misregistration data points 142 with replacement misregistration data points 192. As seen at a next step 210, if outlying raw misregistration data points 142 are to be replaced, outlying raw misregistration data points 142 are replaced by replacement misregistration data points 192 and modified filtered misregistration data 190 is stored.

Whether or not outlying raw misregistration data points 142 are replaced, method 200 continues at a next step 212, at which misregistration of entire multilayered semiconductor device 130 is modeled. It is appreciated that the model generated at step 212 is generated from either filtered misregistration data 170, in the case that outlying raw misregistration data points 142 were not replaced, or from modified filtered misregistration data 190, in the case that outlying raw misregistration data points 142 were replaced at step 210.

At a next step 214, modeled data generated in step 212 is used to calculate correctables for misregistration metrology parameters, and at a next step 216, correctables calculated at step 214 are used to recalibrate the scatterometry metrology tool of step 204, and misregistration of the multilayered semiconductor device 130 measured at step 204 is remeasured using the parameters optimized at step 214, or a different multilayered semiconductor device 130 is measured using the parameters optimized at step 214.

Additionally or alternatively, step 214 includes calculating correctables for the processing of step 202, and step 216 includes processing a multilayered semiconductor device 130 using parameters optimized at step 214. It is appreciated that such processing might include, inter alia, a lithography step or an etching step, and steps 214 and 216 include providing correctables to a lithography tool or an etching tool used in such steps.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A system for measuring misregistration in the manufacture of semiconductor devices comprising:
a scatterometry metrology tool configured to:
perform misregistration measurements at multiple sites on a multilayered semiconductor device, wherein each of said misregistration measurements includes raw misregistration data;
provide filtered misregistration data by removing outlying raw misregistration data points from said raw misregistration data from each of said misregistration measurements, wherein said filtered misregistration data also comprises replacement misregistration data points;
use said filtered misregistration data to model misregistration for said multilayered semiconductor device;
calculate correctables from said modeled misregistration for said multilayered semiconductor device;
recalibrate based on said correctables; and
measure misregistration following said recalibration.

2. The system according to claim 1, wherein said outlying raw misregistration data points are beyond three standard deviations from corresponding data points.

3. The system according to claim 2, wherein said scatterometry metrology tool is further configured to model said raw misregistration data for each of said misregistration measurements, wherein said corresponding data points comprise corresponding data points of said modeled raw misregistration data.

4. The system according to claim 2, wherein said scatterometry metrology tool is further configured to perform misregistration measurements with different parameters at each of said multiple sites on said multilayered semiconductor device and wherein said corresponding data points comprise raw misregistration data points from at least one of said misregistration measurements with different parameters.

5. The system according to claim 2, wherein said corresponding data points comprise raw misregistration data points surrounding said outlying raw misregistration data points.

6. The system according to claim 1, wherein said replacement misregistration data points are generated from an average of raw misregistration data points surrounding each of said outlying raw misregistration data points.

7. The system according to claim 1, wherein said replacement misregistration data points are generated from corresponding raw misregistration data points taken from additional scatterometry misregistration measurements at said multiple sites on said multilayered semiconductor device.

8. The system according to claim 1, wherein said scatterometry metrology tool is further configured to model said raw misregistration data for each of said misregistration measurements and wherein said replacement misregistration data points are generated from corresponding data points of said modeled raw misregistration data.

9. The system according to claim 1, wherein said scatterometry metrology tool is further configured to perform misregistration measurements with different parameters at each of said multiple sites on said multilayered semiconductor device and wherein said replacement misregistration data points are generated from corresponding data points from at least one of said misregistration measurements with different parameters.

10. The system according to claim 1, wherein said scatterometry metrology tool is further configured to perform misregistration measurements at corresponding ones of said multiple sites on a multilayered semiconductor device different from said multilayered semiconductor device provided initially and wherein said replacement misregistration data points are generated from corresponding raw misregistration data points from said corresponding ones of multiple sites.

11. The system according to claim 1, wherein said measurement of misregistration following said recalibration is performed on said multilayered semiconductor device.

12. The system according to claim 1, wherein said measurement of misregistration following said recalibration is performed on a multilayered semiconductor device different from said multilayered semiconductor device provided initially.

13. The system according to claim 1, wherein at least one of said misregistration measurements is taken from a pupil image.

14. The system according to claim 1, wherein all of said misregistration measurements are taken from one or more pupil images.

15. The system according to claim 1, further comprising a lithography tool in electronic communication with said scatterometry metrology tool, wherein said lithography tool receives said correctables from said scatterometry metrology tool.

16. The system according to claim 1, further comprising an etching tool in electronic communication with said scatterometry metrology tool, wherein said etching tool receives said correctables from said scatterometry metrology tool.

* * * * *